(12) United States Patent
Hong et al.

(10) Patent No.: US 8,846,443 B2
(45) Date of Patent: Sep. 30, 2014

(54) ATOMIC LAYER DEPOSITION OF METAL OXIDES FOR MEMORY APPLICATIONS

(75) Inventors: Zhendong Hong, San Jose, CA (US); Hieu Pham, Santa Clara, CA (US); Randall Higuchi, San Jose, CA (US); Vidyut Gopal, Sunnyvale, CA (US); Imran Hashim, Saratoga, CA (US); Tim Minvielle, San Jose, CA (US); Takeshi Yamaguchi, Kanagawa (JP)

(73) Assignees: Intermolecular, Inc., San Jose, CA (US); Kabushiki Kaisha Toshiba, Tokyo (JP); SanDisk 3D LLC, Milpitas, CA (US)

( * ) Notice: Subject to any disclaimer, the term of this patent is extended or adjusted under 35 U.S.C. 154(b) by 350 days.

(21) Appl. No.: 13/198,837

(22) Filed: Aug. 5, 2011

(65) Prior Publication Data

US 2013/0034947 A1  Feb. 7, 2013

(51) Int. Cl.
*H01L 21/00* (2006.01)
*H01L 21/8222* (2006.01)
*H01L 45/00* (2006.01)
*H01L 27/24* (2006.01)

(52) U.S. Cl.
CPC ............ *H01L 45/04* (2013.01); *H01L 45/1616* (2013.01); *H01L 27/2463* (2013.01); *H01L 45/146* (2013.01)
USPC ............ 438/104; 438/329; 438/384; 257/245

(58) Field of Classification Search
USPC .................. 438/104, 329, 384, 385; 257/245, 257/E21.175
See application file for complete search history.

(56) References Cited

U.S. PATENT DOCUMENTS

| | | | |
|---|---|---|---|
| 5,383,088 A | 1/1995 | Chapple-Sokol et al. | |
| 7,961,496 B2 * | 6/2011 | Baek et al. | 365/148 |
| 7,977,153 B2 | 7/2011 | Kumar et al. | |
| 8,008,096 B2 | 8/2011 | Fuchigami | |
| 8,062,743 B2 | 11/2011 | Boardman | |
| 8,097,878 B2 | 1/2012 | Kumar | |

(Continued)

FOREIGN PATENT DOCUMENTS

KR   2002-055181 A   7/2002

OTHER PUBLICATIONS

Inoue et al.; Nonpolar resistance switching of metalbinarytransitionmetal oxidesmetal sandwiches homogenousinhomogenous transition of current distribution; Jan. 1, 2008; National Institute of Advanced Industrial Science and Technology, Japan; Phys. Rev. B 77 035105 2008.

(Continued)

*Primary Examiner* — Hsien Ming Lee

(57) ABSTRACT

Embodiments of the invention generally relate to nonvolatile memory devices and methods for manufacturing such memory devices. The methods for forming improved memory devices, such as a ReRAM cells, provide optimized, atomic layer deposition (ALD) processes for forming a metal oxide film stack which contains at least one hard metal oxide film (e.g., metal is completely oxidized or substantially oxidized) and at least one soft metal oxide film (e.g., metal is less oxidized than hard metal oxide). The soft metal oxide film is less electrically resistive than the hard metal oxide film since the soft metal oxide film is less oxidized or more metallic than the hard metal oxide film. In one example, the hard metal oxide film is formed by an ALD process utilizing ozone as the oxidizing agent while the soft metal oxide film is formed by another ALD process utilizing water vapor as the oxidizing agent.

19 Claims, 3 Drawing Sheets

(56) References Cited

U.S. PATENT DOCUMENTS

| | | | |
|---|---|---|---|
| 8,294,219 | B2 | 10/2012 | Malhotra |
| 8,367,463 | B2 | 2/2013 | Kumar |
| 2007/0155190 | A1* | 7/2007 | Vaartstra et al. ............ 438/789 |
| 2009/0134499 | A1* | 5/2009 | Ahn et al. .................... 257/635 |
| 2009/0272962 | A1* | 11/2009 | Kumar et al. ................... 257/4 |
| 2011/0227026 | A1* | 9/2011 | Sekar et al. ..................... 257/4 |

OTHER PUBLICATIONS

Seo, S., et al; Resistance Switching Mechanism of MetalOxideMetal Structure NiO; ; Samsung Electronics Co., Ltd.; Presentation of Samsung undated.

Goldstein, D., et al.; Al2O3 Atomic Layer Deposition with Trimethylauminum and Ozone Studied by in Situ Transmission FTIR Spectroscopy and Quadrupole Mass Spectrometry; Jan. 1, 2008; The Regents of the University of Colorado; J. Phys. Chem pp. 1953019539.

Kamiyama, S., et al.; Improving Threshold Voltage and Device Performance of GateFirst HfSiONMetal Gate nMOSFETs by an ALD La2O3 Capping Layer; Jan. 1, 2008; The Electrochemical Society; Journal of the Electrochemical Society pp. H373H377.

Groner, M.D., et al.; Electrical characterization of thin Al2O3 films grown by atomic layer deposition on silicon and various metal substrates; Apr. 19, 2002; Z—Book—Elsevier; Thin Solid Films 413 186197.

Min, YS., et al.; Atomic Layer Deposition of Al2O3 Thin Films from a 1Methoxy2methyl2propoxide Complex of Aluminum and Water; Jan. 7, 2005; American Chemical Societyunknown; Chem. Mater. 2005 17 626631.

Kim, K. S. et al.; Low Temperature 100C Deposition of Aluminum Oxide Thin Films by ALD with O3 as Oxidant; Jan. 1, 2006; The Electrochemical Society; Journal of the Electrochemical Society 153 5 F69F76.

JD Ferguson et al.; ALD of SiO2 at Room Temperature Using TEOS and ?H?2?O with ?nh?3 as the Catalyst; Jan. 1, 2004; Journal of the Electrochemical Society.

* cited by examiner

ATOMIC LAYER DEPOSITION OF METAL OXIDES FOR MEMORY APPLICATIONS

BACKGROUND OF THE INVENTION

1. Field of the Invention

Embodiments of the invention generally relate to memory devices and methods for manufacturing such memory devices.

2. Description of the Related Art

Nonvolatile memory elements are used in systems in which persistent storage is required. For example, digital cameras use nonvolatile memory cards to store images and digital music players use nonvolatile memory to store audio data. Nonvolatile memory is also used to persistently store data in computer environments. Nonvolatile memory is often formed using electrically-erasable programmable read only memory (EPROM) technology. This type of nonvolatile memory contains floating gate transistors that can be selectively programmed or erased by application of suitable voltages to their terminals.

As fabrication techniques improve, it is becoming possible to fabricate nonvolatile memory elements with increasingly smaller dimensions. However, as device dimensions shrink, scaling issues are posing challenges for traditional nonvolatile memory technology. This has led to the investigation of alternative nonvolatile memory technologies, including resistive switching nonvolatile memory.

Resistive switching nonvolatile memory is formed using memory elements that have two or more stable states with different resistances. Bistable memory has two stable states. A bistable memory element can be placed in a high resistance state or a low resistance state by application of suitable voltages or currents. Voltage pulses are typically used to switch the memory element from one resistance state to the other. Nondestructive read operations can be performed to ascertain the value of a data bit that is stored in a memory cell.

Resistive switching based on transition metal oxide switching elements formed of metal oxide films has been demonstrated. Although metal oxide films such as these exhibit bistability, the resistance of these films and the ratio of the high-to-low resistance states are often insufficient to be of use within a practical nonvolatile memory device. For instance, the resistance states of the metal oxide film should preferably be significant as compared to that of the system (e.g., the memory device and associated circuitry) so that any change in the resistance state change is perceptible. The variation of the difference in resistive states is related to the resistance of the resistive switching layer. Therefore, a low resistance metal oxide film may not form a reliable nonvolatile memory device. For example, in a nonvolatile memory that has conductive lines formed of a relatively high resistance metal such as tungsten, the resistance of the conductive lines may overwhelm the resistance of the metal oxide resistive switching element. Therefore, the state of the bistable metal oxide resistive switching element may be difficult or impossible to sense.

Similar issues can arise from integration of the resistive switching memory element with current steering elements, such as diodes and/or resistors. The resistance of the resistive switching memory element (at least in its high resistance state) is preferably significant compared to the resistance of the current steering elements, so that the unvarying resistance of the current steering element does not dominate the resistance of the switching memory element, and thus reduce the measurable difference between the "on" and "off" states of the formed memory device (e.g., logic states of the device). However, since the power that can be delivered to a circuit containing a series of resistive switching memory elements and current steering elements is typically limited in most conventional nonvolatile memory devices (e.g., CMOS driven devices), it is desirable to form each of the resistive switching memory elements and current steering elements in the circuit so that the voltage drop across each of these elements is small, and thus resistance of the series connected elements does not cause the current to decrease to an undesirable level due to the fixed applied voltage (e.g., about 2-5 volts).

As nonvolatile memory device sizes shrink, it is important to reduce the required currents and voltages that are necessary to reliably set, reset and/or determine the desired "on" and "off" states of the device to minimize resistive heating of the device and cross-talk between adjacent devices. Moreover, in cases where multiple formed memory devices are interconnected to each other and to other circuit elements it is desirable to minimize the device performance variation between one device to the next to assure that the performance of the formed circuit performs in a desirable manner.

Chemical vapor deposition (CVD) and physical vapor deposition (PVD) may be used to form transition metal oxide films utilized in resistive switching memory elements. However, these vapor deposition processes generally provide limited control to the thickness and the conformity of the deposited transition metal oxide films. Often, CVD or PVD processes are incapable of forming conformal films at sharp interfaces and within trenches or vias having high aspect ratios. The metal oxide films deposited by CVD often pinch-off and form voids within the high aspect ratio trenches and vias. Also, the metal oxide films deposited by CVD generally suffer high concentrations of organic or halide contaminants.

Therefore, there is a need for an efficient and controllable process to form a metal oxide film stack for a nonvolatile memory device.

SUMMARY OF THE INVENTION

Embodiments of the invention generally relate to nonvolatile memory devices and methods for manufacturing such memory devices. The methods for forming improved memory devices, such as a ReRAM cells, provide optimized, atomic layer deposition (ALD) processes for forming a metal oxide film stack containing at least one hard metal oxide film (e.g., metal is completely oxidized or substantially oxidized) and at least one less resistive soft metal oxide film (e.g., metal is less oxidized than hard metal oxide). The hard metal oxide film may be disposed at the top or bottom of the metal oxide film stack and may be deposited by a hard ALD process (e.g., more oxidizing to metal). The soft metal oxide film is less electrically resistive than the hard metal oxide film since the soft metal oxide film is less oxidized and more metallic than the hard metal oxide film.

The described ALD processes are techniques for depositing ultra-thin metal oxide films due to practical advantages which includes simple and accurate thickness control, excellent reproducibility and uniformity, and capability to produce conformal films at sharp interfaces and trenches with high aspect ratio. By optimizing the ratio of metal precursor gas to oxidizer pulses, materials can be made metal rich or metal deficient, which in turn tailors the oxygen defect content and type (vacancy vs. interstitial), resulting in an enhancement or reduction in defect density to facilitate carrier transport. The former is a "softer" film or material which is more of a leaky film, whereas the latter constitutes a "harder" film or material which is less leaky film Specifically designed "harder" (less leaky) metal oxide materials and films, such as stoichiometric hafnium oxide layers or films, may improve switching characteristics when used in combination with a "softer" (more leaky) metal oxide. An appropriately tailored version of hard metal oxide films could potentially resolve the tradeoff between easy breakdown of the soft metal oxide and providing better control of the switching currents for ReRAM device applications. The hard metal oxide materials and films in combination with the soft metal oxide materials and films, as described herein, are promising candidates as dielectric materials for the next-generation of ReRAM device applications.

The metal source gas (e.g., TDMAHf) and the oxidizing agent (e.g., $O_3$) may be sequentially pulsed into the chamber and exposed to the substrate, such that the metal source gas has a much longer pulse time relative to the pulse time used for the oxygen source gas during the hard ALD process. The soft metal oxide film may be deposited using a soft ALD process (e.g., less oxidizing to metal), whereas a different oxidizing agent (e.g., water vapor) and/or different gas pulse widths may be used during the soft ALD process as compared during the hard ALD process.

In one embodiment, a method for fabricating a resistive switching memory element is provided and includes forming the metal oxide film stack on or over a lower electrode disposed on a substrate. The metal oxide film stack by depositing the hard metal oxide film during the hard ALD process, wherein the hard metal oxide film substantially contains $MO_2$, where M is a metal, such as hafnium, zirconium, or titanium, and depositing the soft metal oxide film during a soft ALD process, wherein the soft metal oxide film substantially contains $MO_x$, where M is the same metal selected as the metal of the hard metal oxide film and x is within a range from about 1.70 to about 1.90. In some examples, the hard metal oxide film may be formed on or over the lower electrode during a hard ALD process, and subsequently, the soft metal oxide film may be formed on or over the hard metal oxide film during a soft ALD process. In other examples, the soft metal oxide film may be formed on or over the lower electrode during a soft ALD process, and subsequently, the hard metal oxide film may be formed on or over the hard metal oxide film during a hard ALD process.

The hard ALD process includes sequentially providing or pulsing a metal source gas and an oxidizing agent, such as ozone. In some examples, the metal source gas and the oxidizing agent are provided during the hard ALD process having a metal:oxygen source ratio within a range from about 40 to about 100. In one example, the metal:oxygen source ratio may be about 60. The metal source gas utilized during the hard or soft ALD process may contain a tetrakis(dialkylamino) metal compound, where the metal is hafnium, zirconium or titanium and the oxidizing agent may contain ozone. In some examples, the tetrakis(dialkylamino) metal compound may be a tetrakis(dialkylamino) hafnium compound, such as tetrakis(dimethylamino) hafnium. In other examples, the tetrakis(dialkylamino) metal compound may be a tetrakis(dialkylamino) zirconium compound, such as tetrakis(dimethylamino) zirconium or a tetrakis(dialkylamino) titanium compound, such as tetrakis(dimethylamino) titanium.

In one example, the hard metal oxide film substantially contains $HfO_2$ and the soft metal oxide film substantially contains $HfO_x$, where x is within a range from about 1.70 to about 1.90, such as from about 1.75 to about 1.85. In another example, the hard metal oxide film substantially contains $ZrO_2$ and the soft metal oxide film substantially contains $ZrO_x$, where x is within a range from about 1.70 to about 1.90, such as from about 1.75 to about 1.85. In another example, the hard metal oxide film substantially contains $TiO_2$ and the soft metal oxide film substantially contains $TiO_x$, where x is within a range from about 1.70 to about 1.90, such as from about 1.75 to about 1.85.

In other embodiments, the soft ALD process includes sequentially providing or pulsing a metal source gas and an oxidizing agent, wherein the oxidizing agent may be different than the oxidizing agent utilized during the hard ALD process. For example, the oxidizing agent may be water vapor during the soft ALD process while ozone is the oxidizing agent during the hard ALD process. Alternatively, the same oxidizing agent may be used during the soft ALD process, but utilized at a slower flow rate or at a lower concentration than during the hard ALD process. For example, the metal source gas and the oxidizing agent may be provided at a metal:oxygen source ratio of less than 1 during the soft ALD process, such as within a range from about 0.01 to about 0.80 or from about 0.10 to about 0.50, such as about 0.25.

The method generally includes heating the substrate to a deposition temperature during the hard or soft ALD process. In some examples, the deposition temperature may be within a range from about 200° C. to about 350° C., such as from about 250° C. to about 300° C., such as about 275° C., during the hard ALD process. In other embodiments, the method further includes heating the substrate to an annealing temperature within a range from about 400° C. to about 700° C. for a time period within a range from about 2 minutes to about 10 minutes during an annealing process. Generally, the annealing process is subsequent to the hard ALD process and prior to the soft ALD process. In some examples, the annealing temperature may be within a range from about 475° C. to about 625° C. for a time period within a range from about 3 minutes to about 7 minutes during the annealing process. In one example, the annealing temperature of about 550° C. for about 5 minutes is used during the annealing process.

The hard metal oxide film and the soft metal oxide film may each independently have a thickness of about 100 Å or less, such as within a range from about 5 Å to about 80 Å, such as from about 10 Å to about 50 Å or from about 20 Å to about 40 Å. In some examples, the hard metal oxide film may have a current leakage at −3.0 V within a range from about 0.1 μA to about 1,000 μA, such as within a range from about 1 μA to about 100 μA, for example, at about $1\times10^{-5}$ Å (about 10 μA) at −3.0 V. In other examples, the hard metal oxide film may have a current leakage at −0.5 V within a range from about 0.1 nA to about 50 nA, such as from about 0.5 nA to about 10 nA, for example, at about $2\times10^{-9}$ Å (about 2 nA) at −0.5 V.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the invention generally relate to nonvolatile memory devices and methods for manufacturing such memory devices. The methods for forming improved memory devices, such as a ReRAM cells, provide optimized, atomic layer deposition (ALD) processes for making a metal oxide film stack containing one or more hard metal oxide films and one or more less resistive or soft metal oxide films. The hard metal oxide film is deposited by a hard ALD process (e.g., more oxidizing to metal) and may be disposed at the top or bottom of the metal oxide film stack. The metal source gas (e.g., TDMAHf) and the oxidizing agent (e.g., $O_3$) may be sequentially pulsed into the chamber and exposed to the substrate, such that the metal source gas has a much longer pulse time relative to the pulse time used for the oxygen source gas during the hard ALD process. The soft metal oxide film may be deposited using a different or soft ALD process (e.g., less oxidizing to metal), whereas a different oxidizing agent (e.g., water vapor) and/or different gas pulse widths may be used during the soft ALD process as compared during the hard ALD process. Hard metal oxide films in combination with soft metal oxide films could potentially resolve the tradeoff between easy breakdown of the soft metal oxide films and higher switching currents, with the hard oxide limiting the leakage current and hence, the switching current for ReRAM devices.

Figure 1:
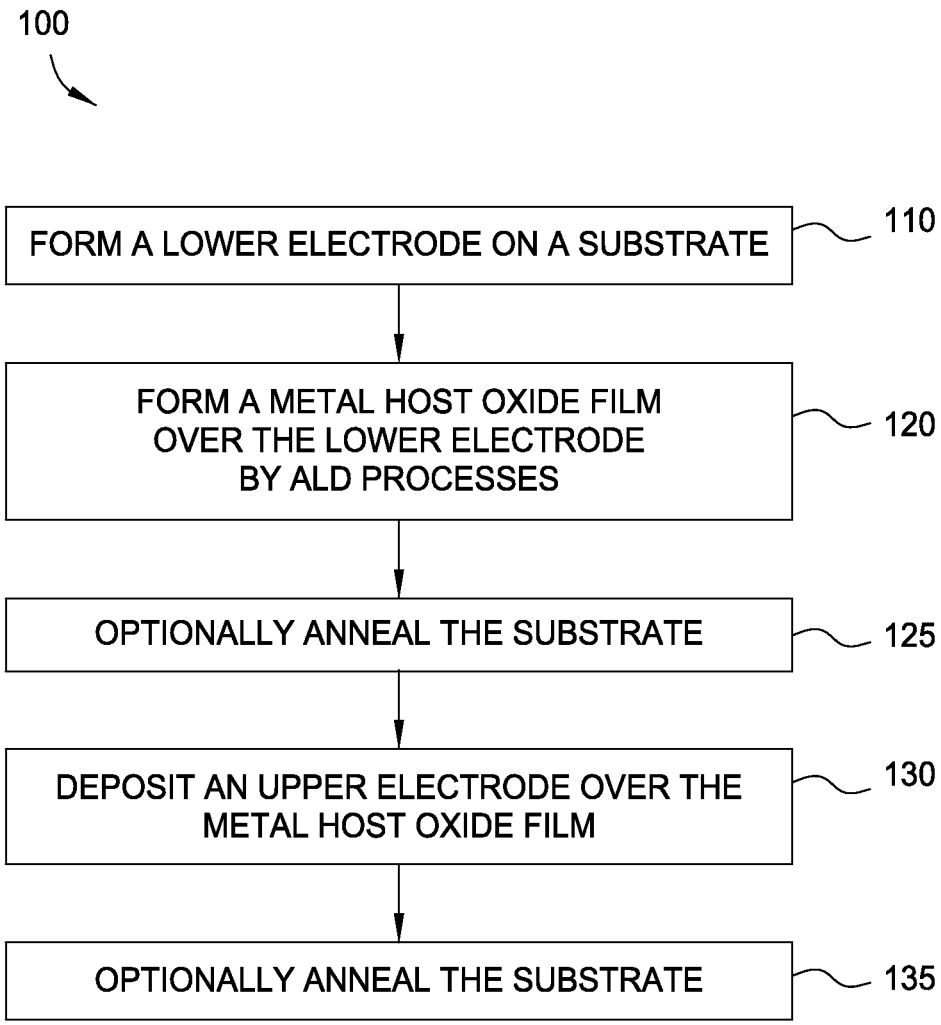
FIG. 1 is a flowchart illustrating a method to form a memory device, as described by embodiments herein.
Figure 2A:
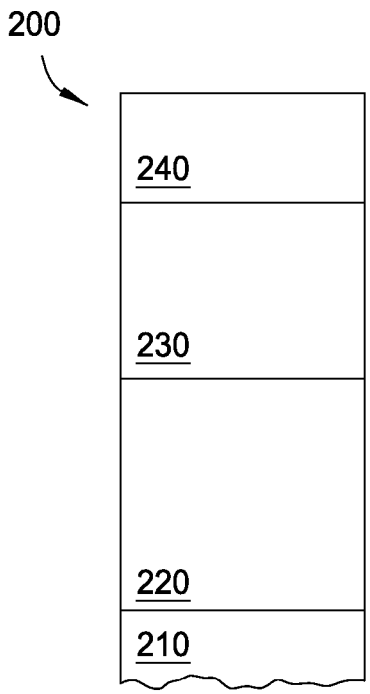
FIG. 2A depicts a memory device which may be formed by a method illustrated in FIG. 1, as described by embodiments herein.

FIG. 1 is a flowchart illustrating a method for manufacturing or otherwise forming various memory devices, as described by embodiments herein, such as process 100 which may be utilized to form resistive switching memory elements/devices, such as memory device 200, as depicted in FIG. 2A. In one embodiment, process 100 may be used to form memory device 200 and includes forming lower electrode 220 on or over substrate 210 during step 110, forming metal oxide film stack 230 on or over lower electrode 220 by at least one ALD process during step 120, optionally annealing memory device 200 during step 125, depositing upper electrode 240 on or over metal oxide film stack 230 during step 130, and optionally annealing memory device 200 during step 135. FIGS. 2B-2G depict a variety of metal oxide film stacks 230 formed by different ALD techniques during step 120.

In some embodiments, the method further includes forming metal oxide film stack 230 by depositing hard metal oxide film 232 during a hard ALD process, wherein hard metal oxide film 232 substantially contains $MO_2$, where M is a metal, such as hafnium, zirconium, or titanium, and depositing soft metal oxide film 234 during a soft ALD process, wherein soft metal oxide film 234 substantially contains $MO_x$, where M is the same metal selected as the metal of hard metal oxide film 232 and x is within a range from about 1.70 to about 1.90, such as from about 1.75 to about 1.85, for example, about 1.8. In some examples, hard metal oxide film 232 may be formed on or over the lower electrode during a hard ALD process, and subsequently, soft metal oxide film 234 may be formed on or over hard metal oxide film 232 during a soft ALD process. In other examples, soft metal oxide film 234 may be formed on or over the lower electrode during a soft ALD process, and subsequently, hard metal oxide film 232 may be formed on or over hard metal oxide film 232 during a hard ALD process.

In one example, hard metal oxide film 232 substantially contains $HfO_2$ and soft metal oxide film 234 substantially contains $HfO_x$, where x is within a range from about 1.70 to about 1.90, such as from about 1.75 to about 1.85. In another example, hard metal oxide film 232 substantially contains $ZrO_2$ and soft metal oxide film 234 substantially contains $ZrO_x$, where x is within a range from about 1.70 to about 1.90, such as from about 1.75 to about 1.85. In another example, hard metal oxide film 232 substantially contains $TiO_2$ and soft metal oxide film 234 substantially contains $TiO_x$, where x is within a range from about 1.70 to about 1.90, such as from about 1.75 to about 1.85.

Process 100 may further be used to form memory device 200 which includes depositing or otherwise forming a variety of metal oxide film stacks 230 by different ALD techniques during step 120, as depicted in FIGS. 2B-2G. Metal oxide film stack 230 contains at least one hard metal oxide film 232, at least one soft metal oxide film 234, and at least one other film 236. Soft metal oxide film 234 is less electrically resistive than hard metal oxide film 232 since soft metal oxide film 234 is less oxidized or more metallic than hard metal oxide film 232. Therefore, soft metal oxide film 234 is metal rich and more leaky relative to hard metal oxide film 232 which has a metal deficient.

In various embodiments, film 236 may optionally be contained within metal oxide film stack 230, as depicted in FIGS. 2B-2G. Film 236 may be below, above, or between hard metal oxide film 232 and soft metal oxide film 234. Film 236 may contain a single layer or multiple layers, such as a host oxide layer, a coupling layer, a switching layer, or other types of layer. Film 236 may contain at least one metal, in metallic form, metal oxide, metal nitride, metal oxynitride, derivatives thereof, alloys thereof, or combinations thereof.

Figure 2B:
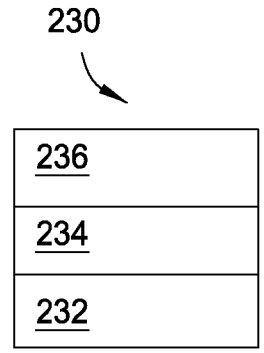
FIGS. 2B-2G depict various metal oxide film stacks which may be formed within the memory device illustrated in FIG. 2A, as described by other embodiments herein.
Figure 2C:
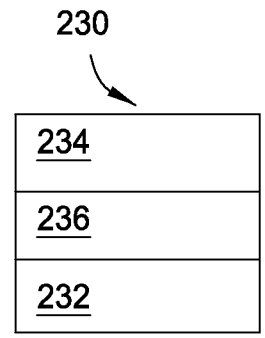
Figure 2D:
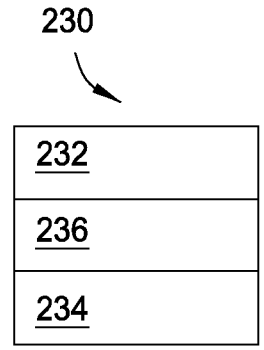
Figure 2E:
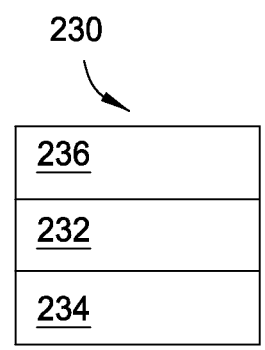
Figure 2F:
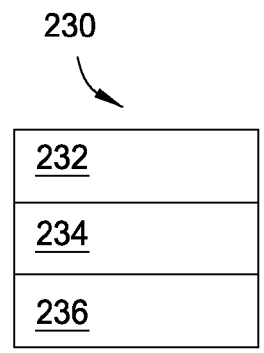
Figure 2G:
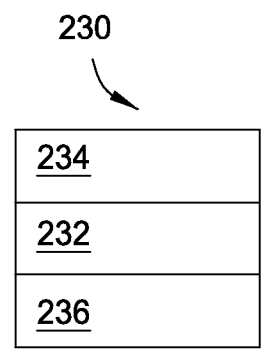

Each of the metal oxide film stacks 230 depicted in FIGS. 2B-2G may be disposed between lower electrode 220 and upper electrode 240, as illustrated in FIG. 2A. Therefore, any of the particular lower layers depicted in each of the metal oxide film stacks 230 may be on or over lower electrode 220. Similarly, upper electrode 240 may be on or over any of the particular upper layers depicted in each of the metal oxide film stacks 230. In one example, as depicted in FIG. 2B, metal oxide film stack 230 contains film 236 disposed on or over soft metal oxide film 234, which is disposed on or over hard metal oxide film 232. In another example, as depicted in FIG. 2C, metal oxide film stack 230 contains soft metal oxide film 234 disposed on or over film 236, which is disposed on or over hard metal oxide film 232. In another example, as depicted in FIG. 2D, metal oxide film stack 230 contains hard metal oxide film 232 disposed on or over film 236, which is disposed on or over soft metal oxide film 234. In another example, as depicted in FIG. 2E, metal oxide film stack 230 contains film 236 disposed on or over hard metal oxide film 232, which is disposed on or over soft metal oxide film 234. In another example, as depicted in FIG. 2F, metal oxide film stack 230 contains hard metal oxide film 232 disposed on or over soft metal oxide film 234, which is disposed on or over film 236. In another example, as depicted in FIG. 2G, metal oxide film stack 230 contains soft metal oxide film 234 disposed on or over hard metal oxide film 232, which is disposed on or over film 236.

In some embodiments, the overall metal oxide film stack 230 may have a thickness within a range from about 20 Å to about 200 Å, such as from about 40 Å to about 100 Å. Hard metal oxide film 232 and soft metal oxide film 234 may each independently have a thickness of about 100 Å or less, such as within a range from about 5 Å to about 80 Å, such as from about 10 Å to about 50 Å or from about 20 Å to about 40 Å. In some examples, hard metal oxide film 232 may have a current leakage at −3.0 V within a range from about 0.1 μA to about 1,000 μA, such as within a range from about 1 μA to about 100 μA, for example, at about $1 \times 10^{-5}$ Å (about 10 μA) at −3.0 V. In other examples, hard metal oxide film 232 may have a current leakage at −0.5 V within a range from about 0.1 nA to about 50 nA, such as from about 0.5 nA to about 10 nA, for example, at about $2 \times 10^{-9}$ Å (about 2 nA) at −0.5 V.

The hard ALD process includes sequentially pulsing, introducing, or otherwise providing a metal source gas and an oxidizing agent, such as ozone, into the deposition chamber and exposing the exposed surface of the processing substrate. In some examples, the metal source gas and the oxidizing agent may be sequentially pulsed, introduced, or otherwise provided during the hard ALD process having a metal:oxygen source ratio of greater than 1, such as within a range from about 10 to about 500, such as from about 20 to about 200, such as from about 40 to about 100, for example, about 60.

The metal:oxygen source ratio is a ratio of the pulse rate of the metal source gas relative to the pulse rate of the oxidizing agent. In one example of a hard ALD process, the metal:oxygen source ratio is about 60 since the pulse rate of the metal source gas is about 3 seconds and the pulse rate of the ozone is about 0.05 seconds.

In another example of a hard ALD process, the metal:oxygen source ratio is about 50 since the pulse rate of the metal source gas is about 2.5 seconds and the pulse rate of the ozone is about 0.05 seconds. In another example of a hard ALD process, the metal:oxygen source ratio is about 150 since the pulse rate of the metal source gas is about 3 seconds and the pulse rate of the ozone is about 0.02 seconds.

The hard ALD process provides that the metal source gas may contain a tetrakis(dialkylamino) metal compound, where the metal is hafnium, zirconium or titanium and the oxidizing agent may contain ozone. In some examples, the tetrakis(dialkylamino) metal compound may be a tetrakis(dialkylamino) hafnium compound, such as tetrakis(dimethylamino) hafnium. In other examples, the tetrakis(dialkylamino) metal compound may be a tetrakis(dialkylamino) zirconium compound, such as tetrakis(dimethylamino) zirconium or a tetrakis(dialkylamino) titanium compound, such as tetrakis(dimethylamino) titanium.

In other embodiments, the soft ALD process includes sequentially pulsing, introducing, or otherwise providing a metal source gas and an oxidizing agent, wherein the oxidizing agent may be different than the oxidizing agent utilized during the hard ALD process. For example, the oxidizing agent may be water vapor during the soft ALD process while ozone is the oxidizing agent during the hard ALD process. Alternatively, the same oxidizing agent may be used during the soft ALD process, but utilized at a slower flow rate or at a lower concentration than during the hard ALD process. For example, the metal source gas and the oxidizing agent may be sequentially pulsed, introduced, or otherwise provided with a metal:oxygen source ratio of less than 1 during the soft ALD process, such as within a range from about 0.01 to about 0.80 or from about 0.10 to about 0.50, such as about 0.25.

In one example of a soft ALD process, the metal:oxygen source ratio is about 0.25 since the pulse rate of the metal source gas is about 0.5 seconds and the pulse rate of the ozone is about 2 seconds. In another example of a soft ALD process, the metal:oxygen source ratio is about 0.18 since the pulse rate of the metal source gas is about 0.5 seconds and the pulse rate of the ozone is about 3 seconds. In another example of a soft ALD process, the metal:oxygen source ratio is about 0.5 since the pulse rate of the metal source gas is about 1 second and the pulse rate of the ozone is about 2 seconds.

Some of the materials and/or layers of metal oxide film stack 230 may be deposited or otherwise formed using a variety of deposition techniques, but in many embodiments described herein, all of the materials and/or layers of metal oxide film stack 230 may be deposited using thermal ALD processes and/or plasma-enhanced ALD (PE-ALD). In one embodiment, hard metal oxide 232 may be formed by a hard ALD process utilizing ozone and soft metal oxide 234 may be formed by a soft ALD process utilizing water vapor. The various materials and/or layers of film 236 may be formed by thermal ALD and/or PE-ALD processes.

The ALD processes described herein, including soft or hard ALD processes, may include heating the substrate or the substrate carrier/pedestal to a deposition temperature within a range from about 50° C. to about 500° C., such as from about 200° C. to about 350° C., such as from about 250° C. to about 300° C. In one example, the deposition temperature during a hard ALD process may be about 275° C. In another example, the deposition temperature during a soft ALD process may be about 250° C.

In one example, a method for forming memory device 200 on the surface of substrate 210 includes forming metal oxide film stack 230 containing at least one hard metal oxide film 232 on or over lower electrode 220 containing polysilicon disposed on substrate 210, optionally annealing the substrate, depositing upper electrode 240 on or over metal oxide film stack 230, and optionally annealing the substrate. Metal oxide film stack 230 generally contains at least one soft metal oxide film 234 and optionally, may contain additionally layers, such as film 236. Lower electrode 220 may contain an n-type polysilicon material and upper electrode 240 may contain titanium nitride.

FIG. 2A depicts memory device 200 containing metal oxide film stack 230 disposed between at least two electrodes, such as lower electrode 220 and upper electrode 240, and lower electrode 220 is disposed or otherwise supported on substrate 210. Substrate 210 supports lower electrode 220 while depositing and forming each of the layers within memory device 200—and for subsequent manufacturing processes. Substrate 210 may be wafer or other substrate and contain silicon, doped silicon, Group III-V materials (e.g., GaAs), or derivates thereof. In most examples described herein, substrate 210 is a crystalline silicon wafer that may be doped with a dopant element. Lower electrode 220 may contain a doped silicon material, for example p-type or n-type (N+) doped polysilicon. Lower electrode 220 may be deposited or otherwise formed on substrate 210 during step 110.

In various embodiments, film 236 may optionally be contained within metal oxide film stack 230, as depicted in FIGS. 2B-2G. Film 236 may be continuous or discontinuous across the substrate surface and may contain a single layer or multiple layers, such as a host oxide layer, a coupling layer, a switching layer, or other types of layer. Film 236 may be below, above, or between hard metal oxide film 232 and soft metal oxide film 234. Film 236 may contain at least one metal, in metallic form, (e.g., Al, Ti, Hf, Zr, Ta, La, Y, or alloys thereof), metal oxide (e.g., aluminum oxide, titanium oxide, hafnium oxide, zirconium oxide, tantalum oxide, lanthanum oxide, or yttrium oxide), metal nitride (e.g., aluminum nitride, titanium nitride, hafnium nitride, zirconium nitride, tantalum nitride, lanthanum nitride, or yttrium nitride), metal oxynitride (e.g., aluminum oxynitride, titanium oxynitride, hafnium oxynitride, zirconium oxynitride, tantalum oxynitride, lanthanum oxynitride, or yttrium oxynitride), derivatives thereof, alloys thereof, or combinations thereof. In some embodiments, film 236 may have a thickness within a range from about 5 Å to about 1,000 Å, such as, from about 50 Å to about 500 Å, such as from about 100 Å to about 200 Å. The various layers and/or materials of film 236 of contained within metal oxide film stack 230 or memory device 200 may be deposited by ALD, PE-ALD, chemical vapor deposition (CVD), low pressure CVD (LP-CVD), plasma-enhanced CVD (PE-CVD), physical vapor deposition (PVD), epitaxy processes, electrochemical plating processes, or electroless deposition, or combinations thereof.

In some embodiments, a coupling layer is a buffering layer that may be disposed on or within metal oxide film stack 230 and provides access to defects within metal oxide film stack 230 during memory operations performed by memory device 200. A coupling layer generally contains a metal oxide material, such as zirconium oxide or aluminum oxide, but in some embodiments, a coupling layer may contain a metal layer (e.g., metallic titanium) or a metal nitride layer (e.g., titanium nitride). In other embodiments, a coupling layer may be deposited as a metal layer that will partially or fully oxidize upon the deposition of upper electrode 240 or upon annealing. A coupling layer may facilitate switching at upper electrode 240 by creating defects near upper electrode 240. For example, if a coupling layer contains a metal such as titanium, during an anneal (such as rapid thermal oxidation or a vacuum anneal), a coupling layer can attract oxygen from the adjacent metal oxide a switching layer, thereby creating oxygen vacancies in metal oxide film stack 230 while oxidizing a coupling layer.

Generally, a coupling layer is thin enough to provide access to defects in metal oxide film stack 230. In some embodiments, a coupling layer may be thinner than metal oxide film stack 230. In one example a coupling layer may have a thickness that is less than 25% of the thickness of metal oxide film stack 230, or a thickness that is less than 10% of the thickness of metal oxide film stack 230. A coupling layer may have a thickness within a range from about 3 Å to about 100 Å. In some embodiments, a coupling layer may have a thickness within a range from about 5 Å to about 25 Å, such as, from about 8 Å to about 20 Å. In other embodiments, a coupling layer may have a thickness within a range from about 15 Å to about 80 Å, such as, from about 20 Å to about 60 Å.

Memory device 200 containing metal oxide film stack 230 may optionally be exposed to a first annealing process, such as a post metal oxide anneal, during step 125 of process 100. In one embodiment, the post metal oxide anneal is subsequent to the hard ALD process and prior to the soft ALD process. Alternatively, the post metal oxide anneal may be subsequent to both of the hard and soft ALD processes. During the post metal oxide anneal, metal oxide film stack 230 may be heated to an annealing temperature within a range from about 250° C. to about 800° C., such as from about 400° C. to about 700° C., or from about 500° C. to about 600° C., for example, about 550° C. Generally, metal oxide film stack 230 may be heated for a time period within a range from about 30 seconds to about 10 minutes, such as from about 1 minute to about 8 minutes, or from about 4 minutes to about 6 minutes during the post metal oxide anneal of step 125. The first annealing process may be conducted within an annealing chamber, vacuum chamber, deposition chamber, or other processing chamber that provides heat to the layers contained within memory device 200, such as metal oxide film stack 230. The chamber pressure may be maintained within a range from about 1 milliTorr to about 760 Torr.

In some examples, metal oxide film stack 230 may be heated to an annealing temperature within a range from about 475° C. to about 625° C. for a time period within a range from about 3 minutes to about 7 minutes during the post metal oxide anneal at step 125. In one example, the annealing temperature of about 550° C. for about 5 minutes is used during the annealing process.

Lower electrode 220 and upper electrode 240 may contain different materials. In some embodiments, lower electrode 220 and upper electrode 240 have work functions that differ by an energy level within a range from about 0.1 eV to about 1 eV, such as, from about 0.4 eV to about 0.6 eV. In some examples, lower electrode 220 may contain a n-type polysilicon material which has a work function within a range from about 4.1 eV to about 4.15 eV and upper electrode 240 may contain a titanium nitride material which has a work function within a range from about 4.5 eV to about 4.6 eV. Other electrode materials that may be contained within lower electrode 220 and/or upper electrode 240 include p-type polysilicon (about 4.9 eV to about 5.3 eV), transition metals, transition metal alloys, transition metal nitrides, transition metal carbides, tungsten (about 4.5 eV to about 4.6 eV), tantalum nitride (about 4.7 eV to about 4.8 eV), molybdenum oxide (about 5.1 eV), molybdenum nitride (about 4.0 eV to about 5.0 eV), iridium (about 4.6 eV to about 5.3 eV), iridium oxide (about 4.2 eV), ruthenium (about 4.7 eV), and ruthenium oxide (about 5.0 eV). Other potential electrode materials for lower electrode 220 and/or upper electrode 240 include a titanium/aluminum alloy (about 4.1 eV to about 4.3 eV), nickel (about 5.0 eV), tungsten nitride (about 4.3 eV to about 5.0 eV), tungsten oxide (about 5.5 eV to about 5.7 eV), aluminum (about 4.2 eV to about 4.3 eV), copper or silicon-doped aluminum (about 4.1 eV to about 4.4 eV), copper (about 4.5 eV), hafnium carbide (about 4.8 eV to about 4.9 eV), hafnium nitride (about 4.7 eV to about 4.8 eV), niobium nitride (about 4.95 eV), tantalum carbide (about 5.1 eV), tantalum silicon nitride (about 4.4 eV), titanium (about 4.1 eV to about 4.4 eV), vanadium carbide (about 5.15 eV), vanadium nitride (about 5.15 eV), and zirconium nitride (about 4.6 eV). For some embodiments described herein, the higher work function electrode receives a positive pulse (as measured compared to a common reference potential) during a reset operation, although other configurations are possible.

In other embodiments, the higher work function electrode receives a negative pulse during a reset operation with respect to the lower work function electrode. Upper electrode 240 may contain metals, metal carbides, metal oxides, or metal nitrides, which include platinum, palladium, ruthenium, ruthenium oxide, iridium, iridium oxide, titanium, titanium nitride, tungsten, tungsten oxide, tungsten nitride, tungsten carbide, tantalum, tantalum oxide, tantalum nitride, tantalum silicon nitride, tantalum carbide, molybdenum, molybdenum oxide, molybdenum nitride, titanium aluminum alloys, nickel, aluminum, doped aluminum, aluminum oxide, copper, hafnium carbide, hafnium nitride, niobium nitride, vanadium carbide, vanadium nitride, zirconium nitride, derivatives thereof, or combinations thereof. In many examples, upper electrode 240 contains titanium, titanium nitride, alloys thereof, or combinations thereof.

Memory device 200 containing upper electrode 240 disposed on or over metal oxide film stack 230 may optionally be exposed to a second annealing process, such as a post electrode anneal, during step 135 of process 100. The post electrode anneal occurs subsequent to the formation of upper electrode 240. During the post electrode anneal, memory device 200, including upper electrode 240 and metal oxide film stack 230, may be heated to an annealing temperature within a range from about 400° C. to about 1,200° C., such as from about 500° C. to about 900° C., or from about 700° C. to about 800° C., for example, about 750° C. Generally, memory device 200 may be heated for a time period within a range from about 10 seconds to about 5 minutes, such as from about 20 seconds to about 4 minutes, or from about 40 seconds to about 2 minutes during the post upper electrode anneal of step 135. The post electrode anneal may be conducted within an annealing chamber, vacuum chamber, deposition chamber, or other processing chamber that provides heat to the layers contained within memory device 200, such as metal oxide film stack 230 and upper electrode 240. The chamber pressure may be maintained within a range from about 1 milliTorr to about 760 Torr.

In some examples, memory device 200 containing upper electrode 240 may be heated to an annealing temperature within a range from about 700° C. to about 800° C. for a time period within a range from about 40 seconds to about 2 minutes during the post upper electrode anneal at step 135. In one example, the annealing temperature of about 750° C. for about 1 minute is used during the annealing process.

Figure 3:
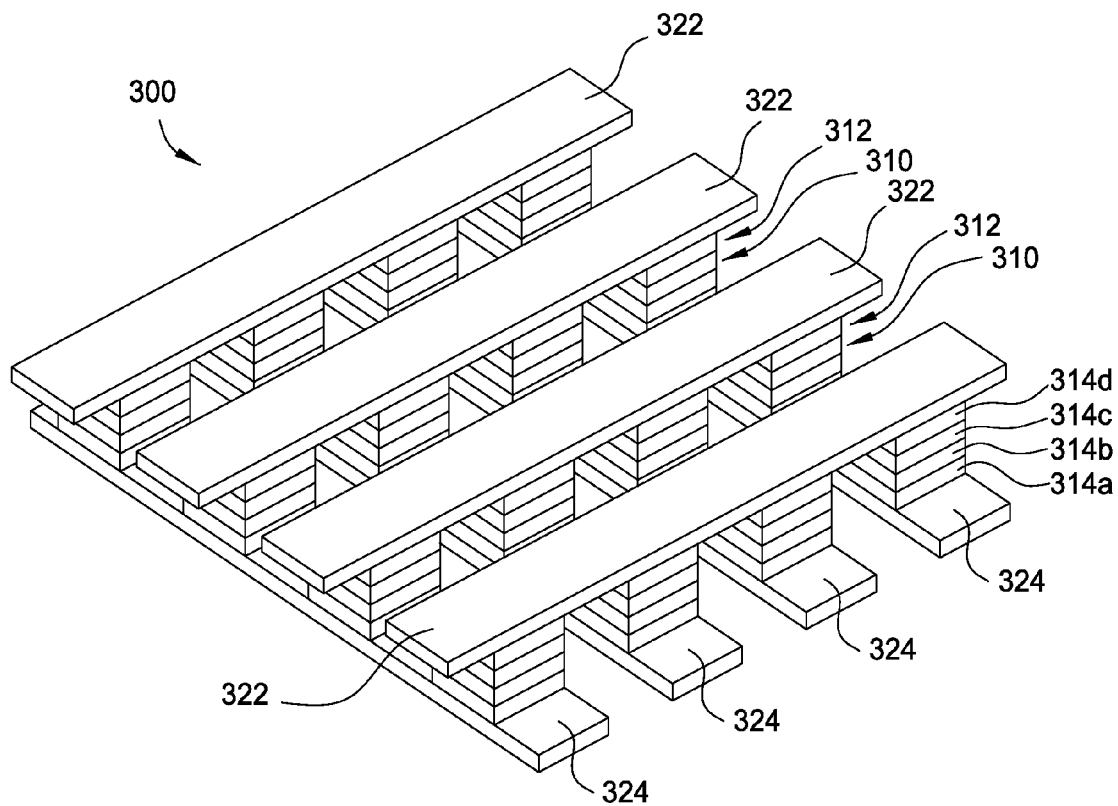
FIG. 3 depicts a memory array of resistive switching memory devices, as described by another embodiment herein.

FIG. 3 depicts a memory array 300 of resistive switching memory devices 310, as described by embodiments herein. Each memory device 310 contains at least one switching memory element 312, and may contain multiple switching memory elements 312. In some embodiments, memory devices 310 may be a plurality of memory devices 200, depicted in FIG. 2A. Each memory device 200 may independently contain any of the metal oxide film stacks 230 illustrated in FIGS. 2B-2G. Memory array 300 may be part of a larger memory device or other integrated circuit structure, such as a system on a chip type device. Read and write circuitry is connected to switching memory devices 310 using electrodes 322 and electrodes 324. Electrodes, such as upper electrodes 322 and lower electrodes 324, are sometimes referred to as word lines and bit lines, and are used to read and write data into the memory elements 312 in the switching memory devices 310. Individual switching memory devices 310 or groups of switching memory devices 310 can be addressed using appropriate sets of electrodes 322 and 324. The memory elements 312 in the switching memory devices 310 may be formed from a plurality of layers 314*a*, 314*b*, 314*c*, and 314*d* containing various materials, as indicated schematically in FIG. 3. In addition, memory arrays such as memory array 300 can be stacked in a vertical fashion to make multilayer memory array structures.

According to various embodiments, resistive-switching memory elements/devices are described herein. The memory elements/devices generally have a structure in which resistive-switching insulating layers are surrounded by two conductive electrodes. Some embodiments described herein are memory elements that include electrodes of different materials (e.g., one electrode is doped silicon and one is titanium nitride) surrounding a resistive-switching layer of a metal oxide (e.g., hafnium oxide), thickness (about 20 Å to about 100 Å) and a coupling layer that is substantially thinner than the resistive-switching layer (e.g., less than 25% the thickness of the resistive-switching layer). In some embodiments, the coupling layer may be a metallic material such as titanium. Memory elements including the coupling layer have exhibited improved switching characteristics (e.g., lower set, reset, and forming voltages, and better retention). In some embodiments, the resistive-switching layer includes a higher bandgap material (e.g., a material having a bandgap greater than 4 eV such as hafnium oxide, aluminum oxide, tantalum oxide, yttrium oxide, zirconium oxide, cerium oxide, alloys thereof, derivatives thereof, or combinations thereof), however other resistive-switching layers may include materials having a bandgap less than 4 eV (e.g., titanium oxide).

In other embodiments, a metal-rich metal oxide switching layer and techniques for forming the metal-rich switching layer are described. The metal-rich switching layer includes increased numbers of defects (e.g., oxygen vacancies), which may be manipulated to improve switching characteristics. The metal-rich switching layer may be deposited, for example, by reducing the degree of oxidation that is occurs in an atomic layer deposition (ALD) or plasma-enhanced ALD (PE-ALD) process. In another embodiment, the coupling layer is a metallic layer (e.g., metallic titanium) that, when the entire stack is annealed, attracts oxygen from the adjacent metal oxide switching layer. This results in an at least partially oxidized coupling layer (e.g., the coupling layer becomes at least partially titanium oxide) and a switching layer that is metal rich. In further embodiments, a metallic capping layer deposited on a coupling layer may be used as a source of dopant metal which is diffused into the metal host oxide of the switching layer.

The switching characteristics of the resistive-switching memory elements may be tailored by controlling the defects within the metal oxides. Switching characteristics include operating voltages (e.g., set, reset, and forming voltages), operating currents (e.g., on and off currents), and data retention. Defect control may be achieved by type, density, energy level, and spatial distribution within the switching layer. These defects then modulate the current flow based on whether they are filled (passivated/compensated) or unfilled (uncompensated). Adding different layers, controlling the formation of the switching layer, implanting, controlling stress, certain thermal treatments are all used to control the defect characteristics. In addition, the defects need not be mobile. For example, a coupling layer and a metallic capping layer may be used to control locations, depths, densities, and/or type of defects, and techniques may be used to form a switching layer having an increased number of defects.

Additionally, the switching layer may have any phase (e.g., crystalline and amorphous) or mixtures of multiple phases. Amorphous-phase metal oxides may have increased resistivity, which in some embodiments can lower the operational currents of the device to reduce potential damage to the memory element.

ALD Processes

The ALD processes for depositing or otherwise forming metal oxide materials contained within metal oxide film stack 230 and other materials and/or layers within memory device 200 are typically conducted in a deposition chamber, such as an ALD chamber. The deposition chamber may maintain an internal pressure of less than 760 Torr, such as within the range from about 10 mTorr to about 10 Torr, such as from about 100 mTorr to about 1 Torr, for example, about 350 mTorr. The temperature of the substrate or the substrate carrier/pedestal is usually maintained within the range from about 50° C. to about 1,000° C., such as from about 100° C. to about 500° C., such as from about 200° C. to about 400° C., or such as from about 250° C. to about 300° C.

The metal source gas may be pulsed, introduced, or otherwise provided into the deposition chamber at a flow rate within the range from about 0.1 sccm to about 200 sccm, such as from about 0.5 sccm to about 50 sccm, from about 1 sccm to about 30 sccm, for example, about 10 sccm. The metal source gas may be provided along with a carrier gas, such as argon or nitrogen. The carrier gas may have a flow rate within the range from about 1 sccm to about 300 sccm, such as from about 2 sccm to about 80 sccm, from about 5 sccm to about 40 sccm, for example, about 20 sccm.

The metal source gas may be pulsed or otherwise provided into the deposition chamber for a time period within a range from about 0.01 seconds to about 10 seconds, depending on the particular process conditions, metal source gas or desired composition of the deposited metal oxide material. In one embodiment, such as for forming a hard metal oxide material, the metal source gas may be pulsed, introduced, or otherwise provided into the deposition chamber for a time period within a range from about 1 second to about 10 seconds, such as from about 1 second to about 5 seconds, for example, about 3 seconds. In another embodiment, such as for forming a soft metal oxide material, the metal source gas may be pulsed, introduced, or otherwise provided into the deposition chamber for a time period within a range from about 0.05 seconds to about 2 seconds, such as from about 0.1 seconds to about 1 second, for example, about 0.5 seconds. In many examples, the metal source gas is a hafnium precursor which is a tetrakis (dialkylamino)hafnium compound, such as tetrakis(dimethylamino) hafnium (($Me_2N$)$_4$Hf or TDMAH), tetrakis(diethylamino) hafnium (($Et_2N$)$_4$Hf or TDEAH), or tetrakis (ethylmethylamino) hafnium ((EtMeN)$_4$Hf or TEMAH).

The metal source gas is generally dispensed into a deposition chamber by introducing a carrier gas through an ampoule containing the metal source or precursor. An ampoule unit may include an ampoule, a bubbler, a canister, a cartridge, or other container used for storing, containing, or dispersing chemical precursors. In another example, the ampoule may contain a liquid precursor (e.g., TDMAH or TDEAH) and be part of a liquid delivery system containing injector valve system used to vaporize the liquid precursor with a heated carrier gas. Generally, the ampoule may be heated to a temperature of about 100° C. or less, such as within a range from about 30° C. to about 90° C., for example, about 50° C.

The oxidizing agent (e.g., $O_2$, $O_3$, $H_2O$) may be pulsed, introduced, or otherwise provided into the deposition chamber for a time period within a range from about 0.01 seconds to about 10 seconds, depending on the particular process conditions, oxygen source gas or oxidizing agent or desired composition of the deposited metal oxide material. In one embodiment, such as for forming a hard metal oxide material, the oxidizing agent may be pulsed, introduced, or otherwise provided into the deposition chamber for a time period within a range from about 0.001 seconds to about 1 second, such as from about 0.001 seconds to about 0.1 seconds, for example, about 0.05 seconds. In another embodiment, such as for forming a soft metal oxide material, the oxidizing agent may be pulsed, introduced, or otherwise provided into the deposition chamber for a time period within a range from about 0.5 second to about 10 seconds, such as from about 1 second to about 3 seconds, for example, about 2 seconds. The oxidizing agent may contain or be formed of or generated from an oxygen source that includes oxygen ($O_2$), atomic oxygen (O), ozone ($O_3$), nitrous oxide ($N_2O$), nitric oxide (NO), nitrogen dioxide ($NO_2$), dinitrogen pentoxide ($N_2O_5$), hydrogen peroxide ($H_2O_2$), derivatives thereof, plasmas thereof, or combinations thereof. Ozone may be formed inside or outside of the deposition chamber, such as the ALD chamber. In one example, the oxidizing agent contains ozone formed by an ozone generator positioned outside of the interior of the deposition chamber. Ozone is generated and then flowed or directed into the deposition chamber and exposed along with the metal source gas to the substrate surface. In another example, the oxidizing agent contains ozone formed by a plasma generated within the interior of the deposition chamber. Oxygen gas flowed or directed into the deposition chamber, then ignited or formed into ozone and/or atomic oxygen before being sequentially exposed along with the metal source gas to the substrate surface.

A carrier gas or a purge gas may be provided at the same time as the metal source gas and/or the oxygen source, but is also provided between the pulses of the metal source gas and/or the oxygen source. The carrier gas or purge gas may continuous flow during the ALD process or may be intermediately and/or sequentially pulsed, introduced, or otherwise provided during the ALD. The carrier gas or purge gas may be pulsed, introduced, or otherwise provided into the deposition chamber for a time period within a range from about 1 second to about 30 seconds, depending on the particular process conditions, source gases, or desired composition of the deposited metal oxide material. In one embodiment, the carrier gas or a purge gas may be pulsed, introduced, or otherwise provided into the deposition chamber for a time period within a range from about 1 second to about 30 seconds, such as from about 2 seconds to about 20 seconds, for example, about 10 seconds or about 15 seconds.

The carrier gas or purge gas may contain nitrogen, argon, helium, hydrogen, a forming gas, oxygen, mixtures thereof, or combinations thereof. The carrier gas or the purge gas may be sequentially pulsed, introduced, or otherwise provided after each pulse of the metal source gas and each pulse of the oxidizing agent during the ALD cycle. The pulses of purge gas or carrier gas are typically pulsed, introduced, or otherwise provided at a flow rate within a range from about 2 standard liters per minute (slm) to about 22 slm, such as about 10 slm. The specific purge gas flow rates and duration of process cycles are obtained through experimentation. In one example, a 300 mm diameter wafer requires about twice the flow rate for the same duration as a 200 mm diameter wafer in order to maintain similar throughput.

Many precursors are within the scope of embodiments of the invention for depositing the dielectric materials described herein. One important precursor property is to have a favorable vapor pressure. Precursors at ambient temperature and pressure may be gas, liquid, or solid. However, volatilized precursors are used within the ALD chamber. Organic-metallic compounds contain at least one metal atom and at least one organic-containing functional group, such as amides, alkyls, alkoxyls, alkylaminos, anilides, or derivatives thereof. Precursors may include organic-metallic, organometallic, inorganic, or halide compounds.

In one embodiment, the metal source gas is formed from or contains a tetrakis(dialkylamino) metal compound, such as a tetrakis(dialkylamino) hafnium compound, a tetrakis(dialkylamino) zirconium compound, or a tetrakis(dialkylamino) titanium compound. Tetrakis(dialkylamino) metal compounds are useful for depositing metal oxides contained within metal oxide film stack 230 and other materials and/or layers within memory device 200 during ALD processes.

In some examples, the metal source gas contains or is formed from exemplary hafnium precursors which include hafnium compounds containing ligands such as halides, alkylaminos, cyclopentadienyls, alkyls, alkoxides, derivatives thereof, or combinations thereof. Hafnium alkylamino compounds useful as hafnium precursors include tetrakis(dialkylamino) hafnium compounds, such as (RR'N)$_4$Hf, where R or R' are independently hydrogen, methyl, ethyl, propyl, or butyl. Hafnium halide compounds useful as hafnium precursors may include $HfCl_4$, $HfI_4$, and $HfBr_4$. Exemplary hafnium precursors useful for depositing hafnium oxides and other hafnium-containing materials contained within metal oxide film stack 230 and other materials and/or layers within memory device 200 during ALD processes include ($Et_2N$)$_4$Hf, ($Me_2N$)$_4$Hf, (MeEtN)$_4$Hf, ($^tBuC_5H_4$)$_2$HfCl$_2$, ($C_5H_5$)$_2$HfCl$_2$, ($EtC_5H_4$)$_2$HfCl$_2$, ($Me_5C_5$)$_2$HfCl$_2$, ($Me_5C_5$)HfCl$_3$, ($^iPrC_5H_4$)$_2$HfCl$_2$, ($^iPrC_5H_4$)HfCl$_3$, ($^tBuC_5H_4$)$_2$HfMe$_2$, (acac)$_4$Hf, (hfac)$_4$Hf, (tfac)$_4$Hf, (thd)$_4$Hf, (NO$_3$)$_4$Hf, ($^t$BuO)$_4$Hf, ($^i$PrO)$_4$Hf, (EtO)$_4$Hf, (MeO)$_4$Hf, or derivatives thereof.

In other examples, the metal source gas contains or is formed from exemplary zirconium precursors which include zirconium compounds containing ligands such as halides, alkylaminos, cyclopentadienyls, alkyls, alkoxides, derivatives thereof, or combinations thereof. Zirconium alkylamino compounds useful as zirconium precursors include tetrakis (dialkylamino) zirconium compounds, such as (RR'N)$_4$Zr, where R or R' are independently hydrogen, methyl, ethyl, propyl, or butyl. Zirconium halide compounds useful as zirconium precursors may include ZrCl$_4$, ZrI$_4$, and ZrBr$_4$. Exemplary zirconium precursors useful for depositing zirconium oxides and other zirconium-containing materials contained within metal oxide film stack 230 and other materials and/or layers within memory device 200 during ALD processes include (Et$_2$N)$_4$Zr, (Me$_2$N)$_4$Zr, (MeEtN)$_4$Zr, ($^t$BuC$_5$H$_4$)$_2$ZrCl$_2$, (C$_5$H$_5$)$_2$ZrCl$_2$, (EtC$_5$H$_4$)$_2$ZrCl$_2$, (Me$_5$C$_5$)$_2$ZrCl$_2$, (Me$_5$C$_5$)ZrCl$_3$, ($^i$PrC$_5$H$_4$)$_2$ZrCl$_2$, ($^i$PrC$_5$H$_4$)ZrCl$_3$, ($^t$BuC$_5$H$_4$)$_2$ZrMe$_2$, (acac)$_4$Zr, (hfac)$_4$Zr, (tfac)$_4$Zr, (thd)$_4$Zr, (NO$_3$)$_4$Zr, ($^t$BuO)$_4$Zr, ($^i$PrO)$_4$Zr, (EtO)$_4$Zr, (MeO)$_4$Zr, or derivatives thereof.

In other examples, the metal source gas contains or is formed from exemplary titanium precursors which include titanium compounds containing ligands such as halides, alkylaminos, cyclopentadienyls, alkyls, alkoxides, derivatives thereof, or combinations thereof. Titanium alkylamino compounds useful as titanium precursors include tetrakis(dialkylamino) titanium compounds, such as (RR'N)$_4$Ti, where R or R' are independently hydrogen, methyl, ethyl, propyl, or butyl. Titanium halide compounds useful as titanium precursors may include TiCl$_4$, TiI$_4$, and TiBr$_4$. Exemplary titanium precursors useful for depositing titanium oxides and other titanium-containing materials contained within metal oxide film stack 230 and other materials and/or layers within memory device 200 during ALD processes include (Et$_2$N)$_4$Ti, (Me$_2$N)$_4$Ti, (MeEtN)$_4$Ti, ($^t$BuC$_5$H$_4$)$_2$TiCl$_2$, (C$_5$H$_5$)$_2$TiCl$_2$, (EtC$_5$H$_4$)$_2$TiCl$_2$, (Me$_5$C$_5$)$_2$TiCl$_2$, (Me$_5$C$_5$)TiCl$_3$, ($^i$PrC$_5$H$_4$)$_2$TiCl$_2$, ($^i$PrC$_5$H$_4$)TiCl$_3$, ($^t$BuC$_5$H$_4$)$_2$TiMe$_2$, (acac)$_4$Ti, (hfac)$_4$Ti, (tfac)$_4$Ti, (thd)$_4$Ti, (NO$_3$)$_4$Ti, ($^t$BuO)$_4$Ti, ($^i$PrO)$_4$Ti, (EtO)$_4$Ti, (MeO)$_4$Ti, or derivatives thereof.

"Atomic layer deposition" as used herein refers to the sequential introduction of two or more reactive compounds to deposit a layer of material on a substrate surface. The two, three or more reactive compounds may alternatively be introduced into a reaction zone of a deposition chamber. Usually, each reactive compound is separated by a time delay to allow each compound to adhere and/or react on the substrate surface. In one aspect, a first precursor or compound A is pulsed into the reaction zone followed by a first time delay. Next, a second precursor or compound B is pulsed into the reaction zone followed by a second delay. During each time delay a purge gas, such as argon or nitrogen, may be pulsed or otherwise provided into the deposition chamber to purge the reaction zone or otherwise remove any residual reactive compound or by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, pulsing compound B and purge gas is a cycle. A cycle can start with either compound A or compound B and continue the respective order of the cycle until achieving a film with the desired thickness.

A "pulse" as used herein is intended to refer to a quantity of a particular compound that is intermittently or non-continuously introduced into a reaction zone of a processing chamber. The quantity of a particular compound within each pulse may vary over time, depending on the duration of the pulse. The duration of each pulse is variable depending upon a number of factors such as, for example, the volume capacity of the deposition chamber employed, the vacuum system coupled thereto, and the volatility/reactivity of the particular compound itself. A "half-reaction" as used herein is intended to refer to a pulse of precursor step followed by a purge step.

While the foregoing is directed to embodiments of the invention, other and further embodiments of the invention may be devised without departing from the basic scope thereof, and the scope thereof is determined by the claims that follow.

The invention claimed is:

1. A method for fabricating a resistive switching memory element, comprising:
   forming a metal oxide film stack over a lower electrode disposed on a substrate, wherein the metal oxide film stack comprises a first metal oxide film and a second metal oxide film, and the metal oxide film stack is formed by:
   forming the first metal oxide film during a first atomic layer deposition process, wherein the first atomic layer deposition process comprises sequentially pulsing a metal source gas and a first oxidizing agent, wherein a pulse rate of the metal source gas is greater than a pulse rate of the first oxidizing agent, and wherein the first metal oxide film substantially comprises MO$_2$, where M is a metal selected from a group consisting of hafnium, zirconium, and titanium; and
   after the forming of the first metal oxide film, forming the second metal oxide film on the first metal oxide film during a second atomic layer deposition process, wherein the second atomic layer deposition process comprises sequentially pulsing the metal source gas and a second oxidizing agent, wherein a pulse rate of the second oxidizing agent is greater than a pulse rate of the metal source gas, and wherein the second metal oxide film substantially comprises MO$_x$, where M is the same metal selected in the first metal oxide film and x is within a range from about 1.70 to about 1.90;
   wherein the first oxidizing agent differs from the second oxidizing agent.

2. The method of claim 1, wherein the metal source gas and the first oxidizing agent are provided at a metal:oxygen source ratio that is greater than 1.

3. The method of claim 2, wherein the metal:oxygen source ratio is about 60.

4. The method of claim 1, wherein the metal source gas comprises a tetrakis(dialkylamino) hafnium compound and the first oxidizing agent comprises ozone.

5. The method of claim 1, wherein the metal source gas comprises a tetrakis(dialkylamino) titanium compound or a tetrakis(dialkylamino) zirconium and the first oxidizing agent comprises ozone.

6. The method of claim 1, wherein the metal source gas and the second oxidizing agent are provided at a metal:oxygen source ratio that is less than 1.

7. The method of claim 6, wherein the metal:oxygen source ratio is about 0.25.

8. The method of claim 1, wherein x is within a range from about 1.75 to about 1.85.

9. The method of claim 1, wherein the first metal oxide film substantially comprises $HfO_2$ and the second metal oxide film substantially comprises $HfO_x$, where x is within a range from about 1.75 to about 1.85.

10. The method of claim 1, wherein the first metal oxide film substantially comprises $ZrO_2$ and the second metal oxide film substantially comprises $ZrO_x$, where x is within a range from about 1.75 to about 1.85.

11. The method of claim 1, wherein the first metal oxide film substantially comprises $TiO_2$ and the second metal oxide film substantially comprises $TiO_x$, where x is within a range from about 1.75 to about 1.85.

12. The method of claim 1, further comprising heating the substrate to a deposition temperature within a range from about 200° C. to about 350° C. during the first atomic layer deposition process.

13. The method of claim 1, further comprising heating the substrate to an annealing temperature within a range from about 400° C. to about 700° C. for a time period within a range from about 2 minutes to about 10 minutes during an annealing process subsequent to the first atomic layer deposition process and prior to the second atomic layer deposition process.

14. The method of claim 1, wherein the first metal oxide film has a current leakage at −3.0 V within a range from about 1 μA to about 100 μA.

15. The method of claim 1, wherein the first metal oxide film has a current leakage at −0.5 V within a range from about 0.5 nA to about 10 nA.

16. The method of claim 1, wherein the first metal oxide film has a thickness within a range from about 20 Å to about 40 Å.

17. The method of claim 1, wherein the lower electrode comprises polysilicon.

18. A method for fabricating a resistive switching memory element, comprising:
  forming a metal oxide film stack over a lower electrode disposed on a substrate, wherein the metal oxide film stack comprises a first metal oxide film and a second metal oxide film, and the metal oxide film stack is formed by:
  forming the first metal oxide film over the lower electrode during a first atomic layer deposition process, wherein the first atomic layer deposition process comprises sequentially pulsing a metal source gas and an oxidizing agent, wherein a pulse rate of the metal source gas is greater than a pulse rate of the oxidizing agent, and wherein the first metal oxide film substantially comprises $MO_2$, where M is a metal selected from a group consisting of hafnium, zirconium, and titanium; and
  after the forming of the first metal oxide film, forming the second metal oxide film over the first metal oxide film during a second atomic layer deposition process, wherein the second atomic layer deposition process comprises sequentially pulsing the metal source gas and the oxidizing agent, wherein a pulse rate of the oxidizing agent is greater than a pulse rate of the metal source gas, and wherein the second metal oxide film substantially comprises $MO_x$, where M is the same metal selected in the first metal oxide film and x is within a range from about 1.70 to about 1.90.

19. A method for fabricating a resistive switching memory element, comprising:
  forming a metal oxide film stack over a lower electrode disposed on a substrate, wherein the metal oxide film stack comprises a metal oxide film and an additional metal oxide film, and the metal oxide film stack is formed by:
  forming the metal oxide film over the lower electrode during an atomic layer deposition process, wherein the atomic layer deposition process comprises sequentially pulsing a metal source gas and a first oxidizing agent, wherein a pulse rate of the first oxidizing agent is greater than a pulse rate of the metal source gas, and wherein the metal oxide film substantially comprises $MO_x$, where M is a metal selected from a group consisting of hafnium, zirconium, and titanium and x is within a range from about 1.70 to about 1.90; and
  after the forming of the metal oxide film, forming the additional metal oxide film over the metal oxide film during a subsequent atomic layer deposition process, wherein the subsequent atomic layer deposition process comprises sequentially pulsing a metal source gas and a second oxidizing agent, wherein a pulse rate of the metal source gas is greater than a pulse rate of the second oxidizing agent, and wherein the additional metal oxide film substantially comprises $MO_2$, where M is the same metal selected in the metal oxide film.

* * * * *